United States Patent
Kurihara et al.

(10) Patent No.: US 9,252,183 B2
(45) Date of Patent: Feb. 2, 2016

(54) SOLID STATE IMAGE PICKUP APPARATUS AND METHOD FOR MANUFACTURING THE SAME

(71) Applicant: CANON KABUSHIKI KAISHA, Tokyo (JP)

(72) Inventors: Masaki Kurihara, Koza-gun (JP); Daisuke Shimoyama, Aiko-gun (JP); Masataka Ito, Chigasaki (JP); Kyouhei Watanabe, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 117 days.

(21) Appl. No.: 14/154,883

(22) Filed: Jan. 14, 2014

(65) Prior Publication Data

US 2014/0199803 A1    Jul. 17, 2014

(30) Foreign Application Priority Data

Jan. 16, 2013   (JP) .................................. 2013-005601
Mar. 7, 2013   (JP) .................................. 2013-045677

(51) Int. Cl.
*H01L 27/146*   (2006.01)

(52) U.S. Cl.
CPC .... *H01L 27/14685* (2013.01); *H01L 27/14621* (2013.01); *H01L 27/14627* (2013.01)

(58) Field of Classification Search
CPC ................... H01L 27/14659; H01L 27/14689; H01L 27/1465; H01L 27/14649
See application file for complete search history.

(56) References Cited

U.S. PATENT DOCUMENTS 6,979,588 B2 * 12/2005 Jeong ................ H01L 27/14627
                                          257/E27.133
7,413,923 B2 *  8/2008 Yun .................. H01L 27/14621
                                          257/431

FOREIGN PATENT DOCUMENTS

JP         2006-295125 A     10/2006

* cited by examiner

*Primary Examiner* — Mohammad Choudhry
(74) *Attorney, Agent, or Firm* — Canon USA Inc. IP Division

(57) ABSTRACT

When forming a hollow portion between each color filter, in order to realize the formation of the hollow portions with a narrower width, a plurality of light receiving portions are formed on the upper surface of a semiconductor substrate, a plurality of color filters corresponding to each of the light receiving portions are formed above the semiconductor substrate, a photoresist is formed on each color filter, side walls are formed on the side surfaces of the photoresist, and a hollow portion is formed between each color filter by performing etching using at least the side walls as a mask.

9 Claims, 10 Drawing Sheets

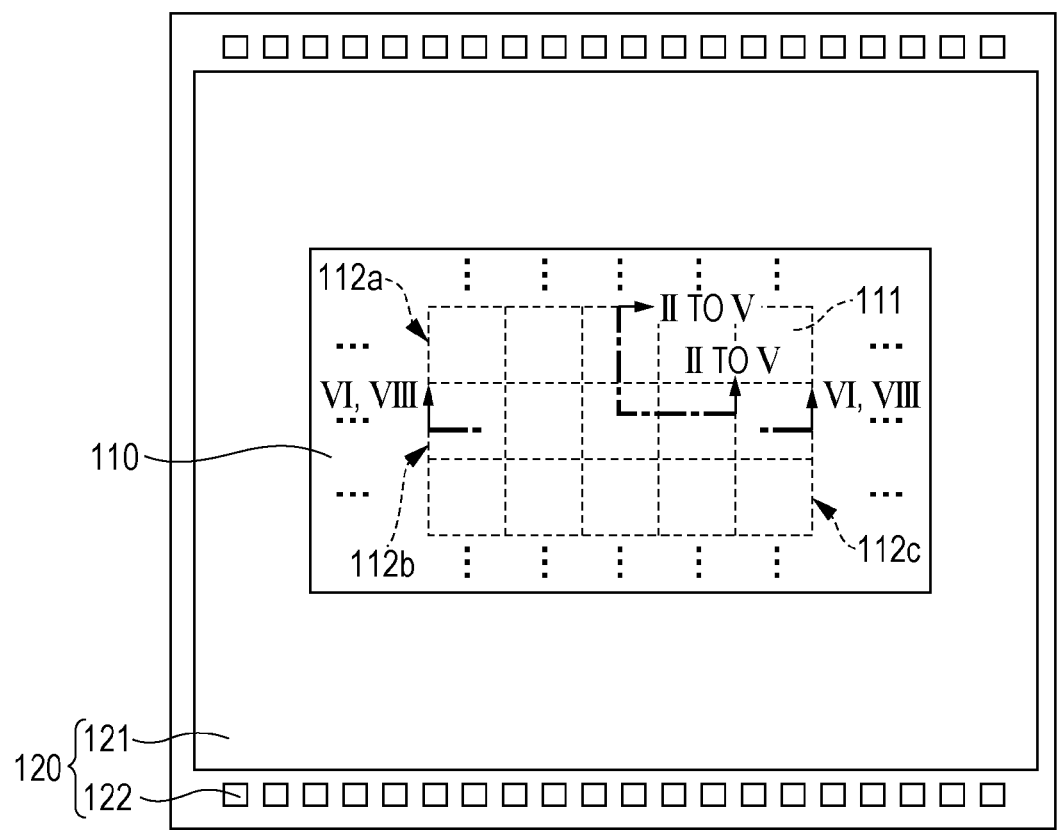

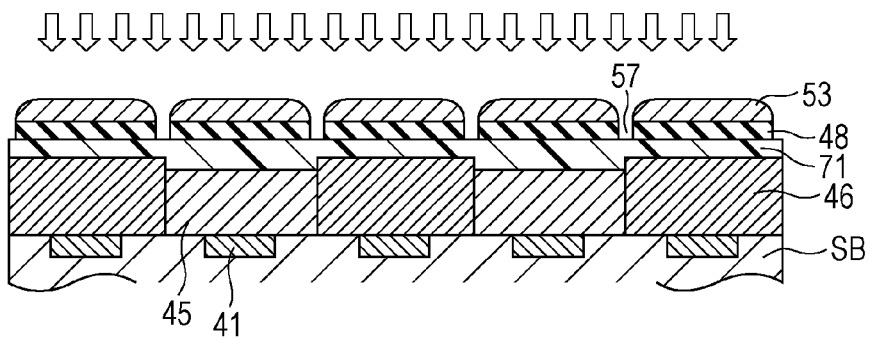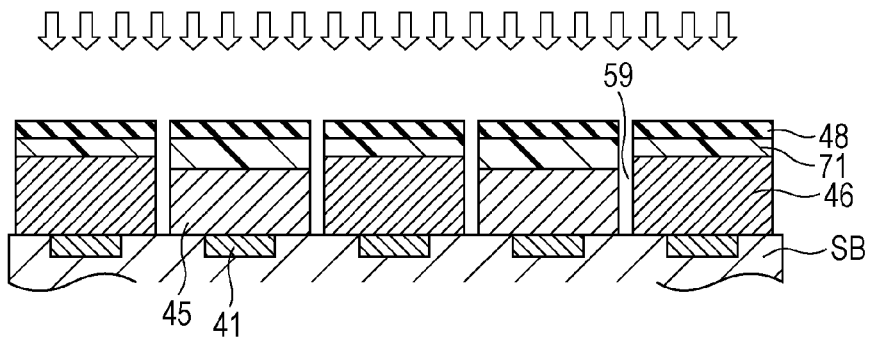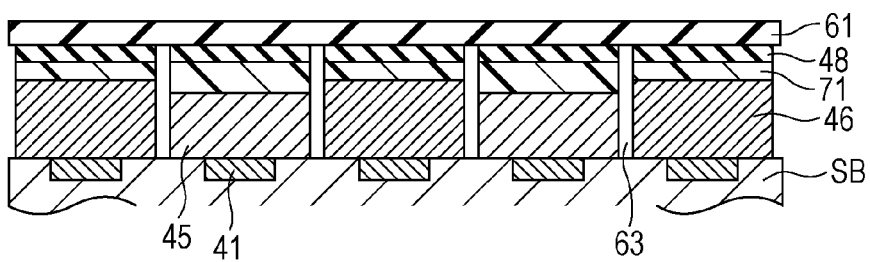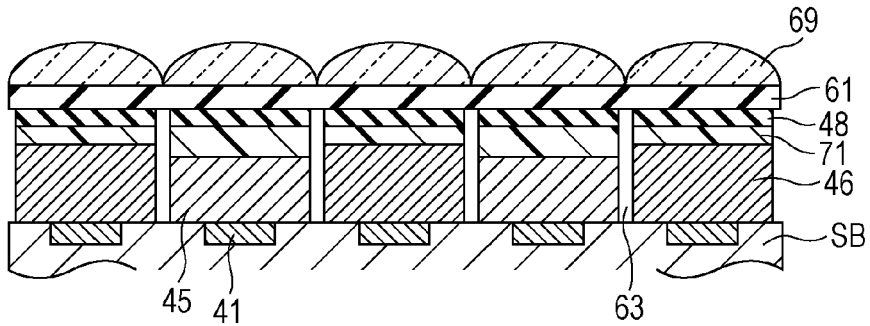

SOLID STATE IMAGE PICKUP APPARATUS AND METHOD FOR MANUFACTURING THE SAME

BACKGROUND OF THE INVENTION

1. Field of the Invention

The present invention relates to a solid state image pickup apparatus (solid state image pickup element), such as a CCD sensor and a CMOS sensor, and a method for manufacturing the same.

2. Description of the Related Art

For the solid state image pickup apparatus, a technique for increasing the light collecting efficiency to light receiving portions, particularly a technique for more efficiently collecting light with sharp incident angle, has been expected. For example, Japanese Patent Laid-Open No. 2006-295125 has proposed a solid state image pickup apparatus having a structure in which hollow portions are formed in regions equivalent to the circumference of light receiving portions to thereby increase the light collecting efficiency to the light receiving portions utilizing the reflection on the interface of the hollow portions.

Specifically, Japanese Patent Laid-Open No. 2006-295125 discloses a technique for forming the above-described hollow portion between each color filter provided above each light receiving portion in such a manner as to correspond to each light receiving portion.

More specifically, according to Japanese Patent Laid-Open No. 2006-295125, for the formation of the above-described hollow portion, first, a photosensitive resin layer is formed on a color filter formation film, and then the photosensitive resin layer is selectively exposed to thereby form a photoresist containing the photosensitive resin layer. Then, etching using the photoresist as a mask is performed to form grooves in the color filter formation film to thereby form a plurality of color filters and also form the hollow portion between each color filter.

However, due to the exposure limit of the photoresist (i.e., limitation by the minimum pattern when developing the photoresist), there has been a limit in narrowing the opening width of the photoresist. According to the technique of Japanese Patent Laid-Open No. 2006-295125 described above, there has been a limit also in narrowing the width of the hollow portion formed between each color filter. For example, according to the technique of Japanese Patent Laid-Open No. 2006-295125 described above, it is difficult to form a hollow portion with a width of about 0.1 μm. Thus, when it is difficult to narrow the width of the hollow portion formed between each color filter, the area occupied by the color filter per pixel becomes small, so that a concern about a reduction in light detection sensitivity by the light receiving portions arises.

SUMMARY OF THE INVENTION

The present invention has been made in view of such problems and aims at providing a method for manufacturing a solid state image pickup apparatus which achieves the formation of a hollow portion with a narrower width when forming the hollow portion between each color filter. The present invention also aims at providing a solid state image pickup apparatus in which a hollow portion with a narrower width is formed between each color filter.

A method for manufacturing a solid state image pickup apparatus of the invention includes a process of forming a plurality of color filters corresponding to each light receiving portion above a semiconductor substrate in such a manner as to contact each other, a process of forming a photoresist having openings above the plurality of color filters, a process of forming side walls on the side surfaces of the photoresist, and a process of forming a hollow portion between each color filter by performing etching using at least the side walls as a mask.

Another method for manufacturing a solid state image pickup apparatus of the invention is a method for manufacturing a solid state image pickup apparatus in which a plurality of light receiving portions are provided on the upper surface of the semiconductor substrate and includes a process of forming a plurality of color filters corresponding to each light receiving portion above a semiconductor substrate in such a manner as to contact each other, a process of forming a hard mask on the plurality of color filters, a process of forming a resist pattern having first openings on the hard mask, a process of heat treating the resist pattern to form an etching mask having second openings whose width is smaller than that of the first openings, a process of performing first etching using the etching mask as a mask to form openings in the hard mask, a process of performing second etching using at least the hard mask as a mask to form an opening between each color filter, and a process of forming a cap layer covering the opening formed between each color filter to form an air gap between each color filter.

The solid state image pickup apparatus of the invention has a plurality of color filters which are formed above the semiconductor substrate and correspond to each light receiving portion, a photoresist formed above the plurality of color filters, and side walls which are formed in such a manner that one end contacts the side surfaces of the photoresist, in which a hollow portion is formed between each color filter, and the hollow portion is formed in alignment with the other end opposite to the one end in the side wall.

Further features of the present invention will become apparent from the following description of exemplary embodiments with reference to the attached drawings.

BRIEF DESCRIPTION OF THE DRAWINGS

FIG. 1 is a top view illustrating an example of the schematic structure of a solid state image pickup apparatus (solid state image pickup device) according to a first embodiment of the invention.

FIG. 8A to 8H are schematic views illustrating an example of a method for manufacturing a solid state image pickup apparatus (solid state image pickup device) according to a sixth embodiment of the invention.

DESCRIPTION OF THE EMBODIMENTS

Figure 2A:
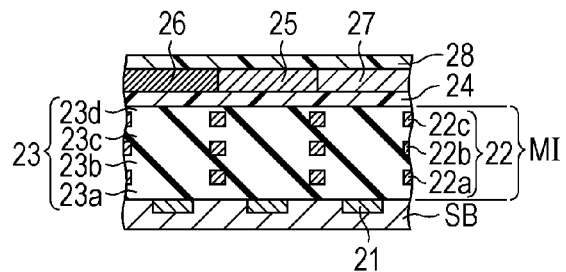
FIGS. 2A to 2H are schematic views illustrating an example of a method for manufacturing the solid state image pickup apparatus (solid state image pickup device) according to the first embodiment of the invention.

Hereinafter, aspects (embodiments) for carrying out the invention are described with reference to the drawings.

First Embodiment

First, a first embodiment of the invention is described.

FIG. 1 is a top view illustrating an example of the schematic structure of a solid state image pickup apparatus (solid state image pickup device) according to the first embodiment of the invention.

A solid state image pickup apparatus 100 according to this embodiment has an image pickup region 110 and a peripheral region 120 other than the image pickup region.

The image pickup region 110 is a region in which pixels 111 are provided in a two-dimensional matrix shape. Each pixel 111 may contain a photoelectric conversion portion, a wiring structure containing a wiring layer and an interlayer insulating layer, a color filter, a microlens, and the like formed on a semiconductor substrate. For example, in this embodiment, the pixels 111 of the image pickup region 110 are arranged in a so-called Bayer pattern. In this case, for example, in a pixel row 112a and a pixel row 112c, a pixel having a green (G) filter (hereinafter referred to as a "green pixel"), a pixel having a red (R) filter (hereinafter referred to as a "red pixel"), a green pixel, a red pixel, and a green pixel are sequentially arranged from the left side. In this case, in a pixel row 112b, a pixel having a blue (B) filter (hereinafter referred to as a "blue pixel"), a green pixel, a blue pixel, a green pixel, and a blue pixel are sequentially arranged from the left side, for example.

Although this embodiment describes an example in which the pixels 111 of the image pickup region 110 are arranged in the Bayer arrangement but the invention is not limited to this aspect and another arrangement may be acceptable. Moreover, this embodiment describes an example in which so-called primary color based color filters containing RGB are applied as the color filter type but the invention is not limited to this aspect and so-called complementary color based color filters may be acceptable, for example.

The peripheral region 120 contains a light shielding filter 121, pad electrodes 122, and the like of a peripheral circuit portion.

Next, each process in a method for manufacturing a solid state image pickup apparatus (solid state image pickup device) 100-1 according to the first embodiment of the invention is described with reference to FIGS. 2A to 2H.

FIGS. 2A to 2H are schematic views illustrating an example of the method for manufacturing the solid state image pickup apparatus (solid state image pickup device) according to the first embodiment of the invention. The cross sectional views illustrated in FIGS. 2A to 2H are schematic views illustrating the II-II cross section in the pixel row 112b illustrated in FIG. 1.

First, FIG. 2A is described.

First, a plurality of light receiving portions 21 are formed in a two-dimensional matrix shape, for example, on the front surface (upper surface) of a semiconductor substrate (hereinafter also simply referred to as a substrate) SB. Herein, the substrate SB is a silicon substrate, for example and the light receiving portion 21 is a photoelectric conversion element (photodiode), for example.

Subsequently, a multilayer wiring structure MI is formed on the substrate SB. This multilayer wiring structure MI is produced by successively forming a first interlayer insulating layer 23a, a first wiring layer 22a, a second interlayer insulating layer 23b, a second wiring layer 22b, a third interlayer insulating layer 23c, a third wiring layer 22c, and a fourth interlayer insulating layer 23d on the substrate SB, for example. In the example illustrated in FIG. 2A, the upper surface of the fourth interlayer insulating layer 23d is planarized but may not be planarized. More specifically, the upper surface of the fourth interlayer insulating layer 23d may be unevenness. Herein, the first interlayer insulating layer 23a to the fourth interlayer insulating layer 23d are collectively referred to as "interlayer insulating layers 23" and the first wiring layer 22a to the third wiring layer 22c are collectively referred to as "wiring layers 22". The wiring layers 22 may be formed by a so-called damascene method (method including forming grooves in the interlayer insulating layers 23 as the underground, and then embedding metal layers serving as the wiring layers 22 in the grooves) or may be formed by a so-called etching method (a technique for forming metal layers on the interlayer insulating layers 23 as the underground, and then pattern-forming the metal layers by etching). The interlayer insulating layers 23 are formed with an inorganic material, such as silicon oxide, silicon nitride, or silicon oxynitride, for example. In this embodiment, the interlayer insulating layers 23 are formed with silicon oxide.

Subsequently, a first planarized layer 24 is formed on the multilayer wiring structure MI. The first planarized layer 24 is formed with, for example, an acrylic resin based organic material.

Subsequently, a first color filter 25, a second color filter 26, and a third color filter 27 are formed on the first planarized layer 4 using a photolithography method. Herein, each of the color filters 25 to 27 is provided above light receiving portions 21 corresponding to each light receiving portion 21 and is formed with an acrylic resin based organic material, for example. Herein, the color filters 25 to 27 are formed in such a manner as to contact each other as illustrated in FIG. 2A. In the example illustrated in FIG. 2A, the color filters 25 to 27 are formed with the almost same film thickness but may be formed with a different film thickness.

Subsequently, a second planarized layer 28 is formed on the color filters 25 to 27. The second planarized layer 28 is formed with an acrylic resin based organic material, for example.

Figure 2E:
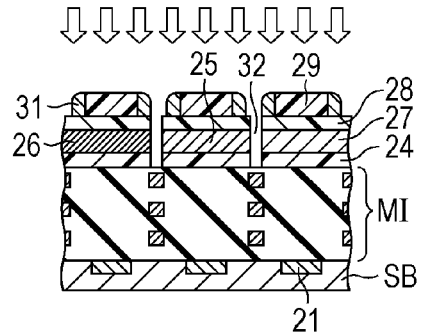
Figure 2B:
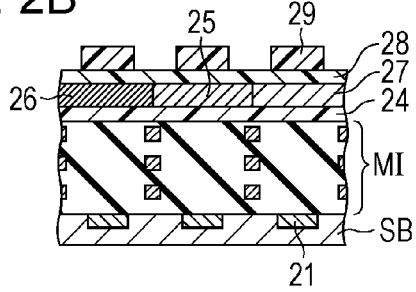

Then, as illustrated in FIG. 2B, a photoresist 29 having an opening in the upper region of the boundary portion of each of the color filters 25 to 27 is formed on the second planarized layer 28 using a photolithography method. Herein, the photoresist 29 contains a heat resistant material resistant to 200° C. or higher, for example. The photoresist 29 contains a material with a transmittance of light having a wavelength of 400 nm to 700 nm of 80% or more, for example. In the description of the invention, the boundary region of each color filter refers to a surface where each color filter contacts each other in the film thickness direction of each color filter. More specifically, in the case where the color filters are formed in such a manner that an end portion of a certain color filter is overlapped with and covers an end portion of another color filter, a region where the end portions of adjacent color filters are overlapped and covered with each other is not included in the boundary region in the invention.

Figure 2F:
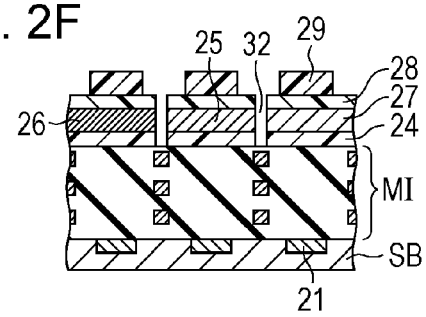
Figure 2C:
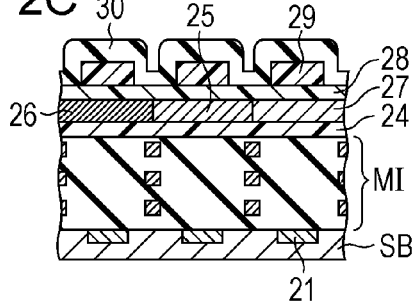

Then, as illustrated in FIG. 2C, an oxide film 30 is formed over the entire surface including the upper surface and the side surfaces of the photoresist 29 using a CVD method, for example. The oxide film 30 is formed with silicon oxide, for example and the film forming temperature is about 200° C.

Figure 2G:
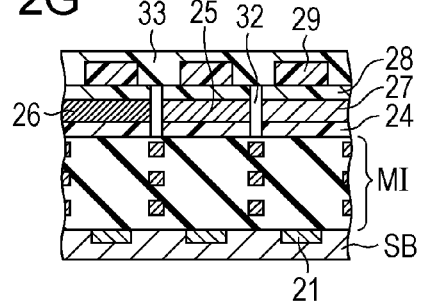
Figure 2D:
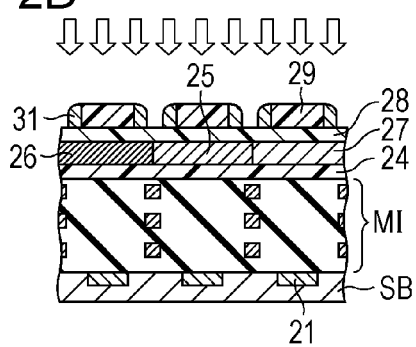

Then, as illustrated in FIG. 2D, the oxide film 30 is etched (etched back) using an anisotropic dry etching method in such a manner as to leave the oxide film on the side surfaces (side walls) of the photoresist 29 to form side walls 31 containing the oxide film. In this case, the side walls 31 are formed in such a manner as not to cover the upper region of the boundary portion of each of the color filters 25 to 27 as illustrated in FIG. 2D. Gas used when etching back the oxide film 30 is mixed gas of fluorocarbon gas, such as CF4, and Ar gas, for example. The flow rates thereof are 12 [sccm] and 400 [sccm], respectively. As the fluorocarbon gas, other fluorocarbon gas other than CF4, such as C2F6, may be used. With respect to rare gas, Ne, Kr, Xe, and the like other than Ar may be used. Other gas may be added as required. Although the example in which the side walls 31 are formed leaving the oxide film 30 only on the side surfaces (side walls) of the photoresist 29 is shown in the example illustrated in FIG. 2, this embodiment is not limited thereto. For example, the side walls 31 are formed leaving the oxide film 30 on the side surfaces (side walls) of the photoresist 29 and also the oxide film 30 may be left also on the upper surface of the photoresist 29. By leaving the oxide film 30 also on the upper surface of the photoresist 29 as described above, a hollow portion (air gap) 32 can be surely formed only between each of the color filters 25 to 27 from the selection ratio of the etching rate in the etching process illustrated in FIG. 2E which is the following process.

Subsequently, by etching using the photoresist 29 and the side walls 31 (or the oxide film 30 left on the upper surface of the photoresist 29 and the side walls 31) as a mask, the second planarized layer 28, each of the color filters 25 to 27, and the first planarized layer 24 in portions which are not covered with the mask are removed as illustrated in FIG. 2E. More specifically, the boundary portion and the like of each of the color filters 25 to 27 are removed. Thus, the hollow portion 32 is formed between each of the color filters 25 to 27. In this embodiment, dry etching is used as the etching illustrated in FIG. 2E. This dry etching is suitably a method with high directivity. As the etching conditions thereof, the selection ratio of the etching rate of the side walls 31 and each of the color filters 25 to 27 is suitably high. The gas for use in the dry etching is oxygen gas, carbon monoxide gas, and nitrogen gas, for example. The flow rates thereof are 5 [sccm], 80 [sccm], and 40 [sccm], respectively. In addition thereto, rare gas, such as Ar, may be added.

The film thickness of the oxide film 30 can be set as appropriate according to the width of the hollow portion 32 to be formed.

Then, the side walls 31 are removed as illustrated in FIG. 2F (when the oxide film 30 is left on the upper surface of the photoresist 9 in the process of FIG. 2D, the oxide film 30 is also removed with the side walls 31).

Then, as illustrated in FIG. 2G, a third planarized layer 33 is formed over the entire surface including the upper surface of the photoresist 29 and the upper surface of the second planarized layer 28. The third planarized layer 33 functions as a cap layer covering the opening regions of the hollow portions 32. For the third planarized layer 33, an inorganic material, such as silicon oxide or silicon nitride, for example and an acrylic resin based organic material, for example, can be used. In this embodiment, the third planarized layer 33 is formed with an organic material.

Figure 2H:
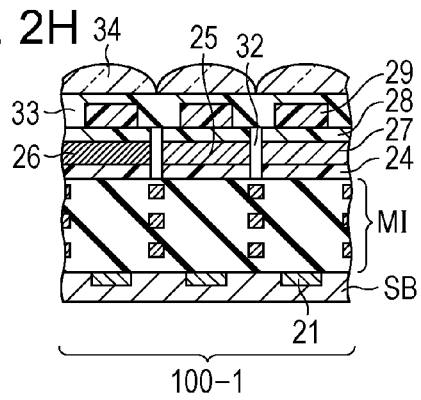

Then, as illustrated in FIG. 2H, a microlens 34 corresponding to each light receiving portion 21 is formed on the third planarized layer 33 in the upper region of each light receiving portion 21. The microlens 34 is formed with an acrylic resin based organic material, for example.

By passing through the processes described above of FIG. 2A to FIG. 2H, the solid state image pickup apparatus (solid state image pickup device) 100-1 according to this embodiment is produced. In this embodiment, each of the color filters 25 to 27 is formed using a photolithography method but the invention is not limited to this aspect.

In the first embodiment, first, the photoresist 29 having an opening in the upper region of the boundary portion of each of the color filters 25 to 27 is formed above each of the color filters 25 to 27. Then, the side walls 31 which do not cover the upper region of the boundary portion of each of the color filters 25 to 27 are formed on the side surfaces of the photoresist 29. Thereafter, the boundary portion of each of the color filters 25 to 27 is removed by etching using at least the side walls 31 as a mask to form the hollow portion 32 between each of the color filters 25 to 27.

According to this configuration, the hollow portions 32 are formed by etching using the side walls 31 formed on the side surfaces of the photoresist 29 as a mask, and therefore the hollow portions 32 with a narrower width (for example, about 0.1 μm) can be formed. Thus, the area occupied by the color filter per pixel can be increased, so that the light detection sensitivity by the light receiving portions 21 can be increased.

Second Embodiment

Next, a second embodiment of the invention is described.

Figure 3A:
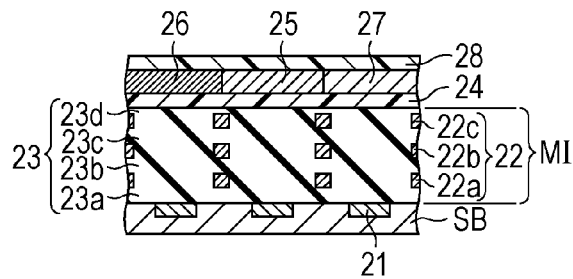
FIG. 3A to 3G are schematic views illustrating an example of a method for manufacturing a solid state image pickup apparatus (solid state image pickup device) according to a second embodiment of the invention.
Figure 3B:
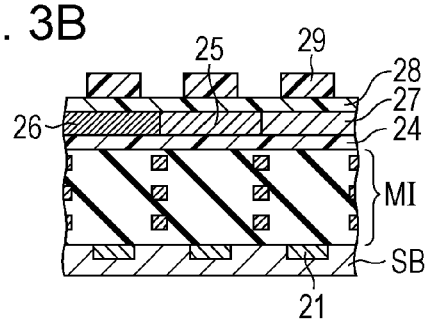

FIGS. 3A to 3G are schematic views illustrating an example of a method for manufacturing a solid state image pickup apparatus (solid state image pickup device) according to the second embodiment of the invention. In FIGS. 3A to 3G, the same configurations as those of illustrated in FIGS. 2A to 2H are designated by the same reference numerals. The cross sectional views illustrated in FIGS. 3A to 3B are schematic views illustrating the III-III cross section in the pixel row 112b illustrated in FIG. 1.

Although FIG. 3A is the same as that of FIG. 2A in the first embodiment, FIG. 3A is described first.

First, a plurality of light receiving portions 21 are formed in a two-dimensional matrix shape, for example, on the front surface (upper surface) of the substrate SB. Herein, the substrate SB is a silicon substrate, for example and the light receiving portion 21 is a photoelectric conversion element (photodiode), for example.

Subsequently, a multilayer wiring structure MI is formed on the substrate SB. This multilayer wiring structure MI is produced by successively forming a first interlayer insulating layer 23a, a first wiring layer 22a, a second interlayer insulating layer 23b, a second wiring layer 22b, a third interlayer insulating layer 23c, a third wiring layer 22c, and a fourth interlayer insulating layer 23d on the substrate SB, for example. In the example illustrated in FIG. 3A, the upper surface of the fourth interlayer insulating layer 23d is planarized but may not be planarized. More specifically, the upper surface of the fourth interlayer insulating layer 23d may be unevenness. Herein, the first interlayer insulating layer 23a to the interlayer insulating layer 23d are collectively referred to as "interlayer insulating layers 23" and the first wiring layer 22a to the third wiring layer 22c are collectively referred to as "wiring layers 22". The wiring layers 22 may be formed by a so-called damascene method (method including forming grooves in the interlayer insulating layers 23 as the underground, and then embedding metal layers serving as the wiring layers 22 in the grooves) or may be formed by a so-called etching method (a technique for forming metal layers on the interlayer insulating layers 23 as the underground, and then pattern-forming the metal layers by etching). The interlayer insulating layers 23 are formed with an inorganic material, such as silicon oxide, silicon nitride, or silicon oxynitride, for example. In this embodiment, the interlayer insulating layers 23 are formed with silicon oxide.

Subsequently, a first planarized layer 24 is formed on the multilayer wiring structure MI. The first planarized layer 24 is formed with, for example, an acrylic resin based organic material.

Subsequently, a first color filter 25, a second color filter 26, and a third color filter 27 are formed on the first planarized layer 24 using a photolithography method. Herein, each of the color filters 25 to 27 is provided above light receiving portions 21 corresponding to each light receiving portion 21 and is formed with an acrylic resin based organic material, for example. Herein, the color filters 25 to 27 are formed in such a manner as to contact each other as illustrated in FIG. 3A. In the example illustrated in FIG. 3A, the color filters 25 to 27 are formed with the almost same film thickness but may be formed with a different film thickness.

Subsequently, a second planarized layer 28 is formed on the color filters 25 to 27. The second planarized layer 28 is formed with an acrylic resin based organic material, for example.

Then, similarly as in FIG. 2B in the first embodiment, a photoresist 29 having an opening in the upper region of the boundary portion of each of the color filters 25 to 27 is formed above the second planarized layer 28 using a photolithography method as illustrated in FIG. 3B. Herein, the photoresist 29 contains a heat resistant material resistant to 200° C. or higher, for example. The photoresist 29 contains a material with a transmittance of light having a wavelength of 400 nm to 700 nm of 80% or more, for example.

Figure 3C:
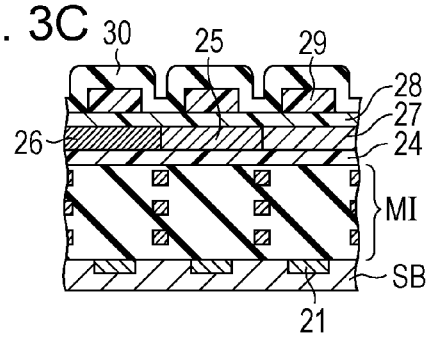

Then, similarly as in FIG. 2C in the first embodiment, an oxide film 30 is formed over the entire surface including the upper surface and the side surfaces of the photoresist 29 using a CVD method, for example, as illustrated in FIG. 3C. The oxide film 30 is formed with silicon oxide, for example and the film forming temperature is about 200° C.

Figure 3D:
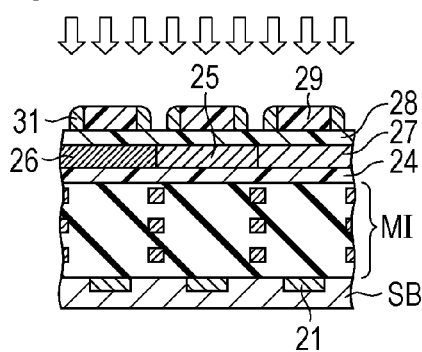

Then, similarly as in FIG. 2D in the first embodiment, the oxide film 30 is etched back using an anisotropic dry etching method to leave the oxide film on the side surfaces (side walls) of the photoresist 29 to form side walls 31 containing the oxide film as illustrated in FIG. 3D. In this case, the side walls 31 are formed in such a manner as not to cover the upper region of the boundary portion of each of the color filters 25 to 27 as illustrated in FIG. 3D. Gas used when etching back the oxide film 30 is CF4 and Ar, for example. The flow rates thereof are 12 [sccm] and 400 [sccm], respectively. Although the example in which the side walls 31 are formed leaving the oxide film 30 only on the side surfaces (side walls) of the photoresist 29 is shown in the example illustrated in FIG. 3, this embodiment is not limited thereto. For example, the side walls 31 are formed leaving the oxide film 30 on the side surfaces (side walls) of the photoresist 29 and also the oxide film 30 may be left also on the upper surface of the photoresist 29. By leaving the oxide film 30 also on the upper surface of the photoresist 29 as described above, a hollow portion 32 can be surely formed only between each of the color filters 25 to 27 from the selection ratio of the etching rate in the etching process illustrated in FIG. 3E which is the following process.

Figure 3E:
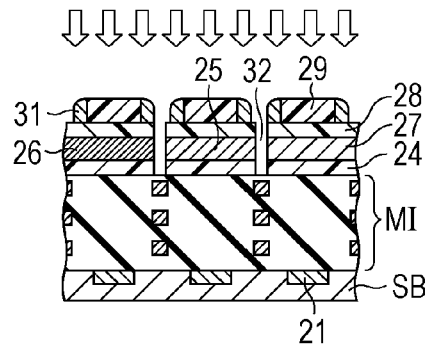

Subsequently, similarly as in FIG. 2E in the first embodiment, by etching using the photoresist 29 and the side walls 31 (or the oxide film 30 left on the upper surface of the photoresist 29 and the side walls 31) as a mask, the second planarized layer 28, each of the color filters 25 to 27, and the first planarized layer 24 in portions which are not covered with the mask are removed as illustrated in FIG. 3E. More specifically, the boundary portion and the like of each of the color filters 25 to 27 are removed. Thus, the hollow portion 32 is formed between each of the color filters 25 to 27. In this embodiment, dry etching is used as the etching illustrated in FIG. 3E. This dry etching is suitably a method with high directivity. As the etching conditions thereof, the selection ratio of the etching rate of the side walls 31 and each of the color filters 25 to 27 is suitably high. The gas for use in the dry etching is oxygen gas, carbon monoxide gas, and nitrogen gas, for example. The flow rates thereof are 5 [sccm], 80 [sccm], and 40 [sccm], respectively.

The film thickness of the oxide film 30 can be set as appropriate according to the width of the hollow portion 32 to be formed.

Figure 3F:
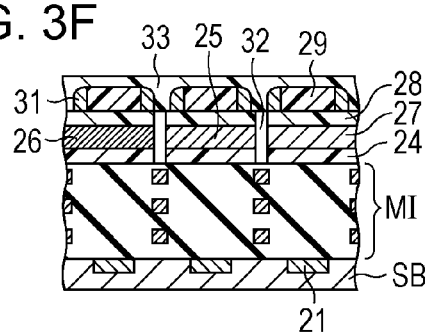

Then, as illustrated in FIG. 3F, a third planarized layer 33 is formed over the entire surface including the upper surface of the photoresist 29 (or when the oxide film 30 is left on the upper surface of the photoresist 29 in the process of FIG. 3D, the upper surface of the oxide film 30). The third planarized layer 33 functions as a cap layer sealing the opening region of the hollow portions 32. For the third planarized layer 33, an inorganic material, such as silicon oxide or silicon nitride, for example and an acrylic resin based organic material, for example, can be used. In this embodiment, the third planarized layer 33 is formed with an organic material.

Figure 3G:
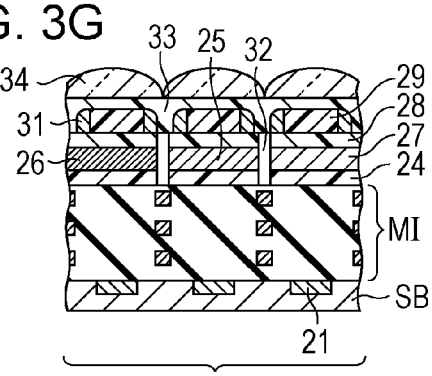

Then, as illustrated in FIG. 3G, a microlens 34 corresponding to each light receiving portion 21 is formed on the third planarized layer 33 in the upper region of each light receiving portion 21. The microlens 34 is formed with an acrylic resin based organic material, for example.

By passing through the processes above of FIG. 3A to FIG. 3G, the solid state image pickup apparatus (solid state image pickup device) 100-2 according to this embodiment is produced. In this embodiment, each of the color filters 25 to 27 is formed using a photolithography method but the invention is not limited to this aspect.

According to the second embodiment, the hollow portions 32 are formed by etching using the side walls 31 formed on the side surfaces of the photoresist 29 as a mask, and therefore the hollow portions 32 with a narrower width (for example, about 0.1 µm) can be formed. Thus, the area occupied by the color filter per pixel can be increased, so that the light detection sensitivity by the light receiving portions 21 can be increased.

Moreover, in the second embodiment, since the removal process of the side walls 31 illustrated in FIG. 2F in the first embodiment is not performed, the side walls 31 are formed in the solid state image pickup apparatus 100-2 according to the second embodiment. More specifically, in the solid state image pickup apparatus 100-2 according to the second embodiment, the side walls 31 are formed in such a manner that one end contacts the side surfaces of the photoresist 29 and the hollow portion 32 is formed in alignment with the other end opposite to the one end in the side walls 31.

Third Embodiment

Next, a third embodiment of the invention is described.

Figure 4A:
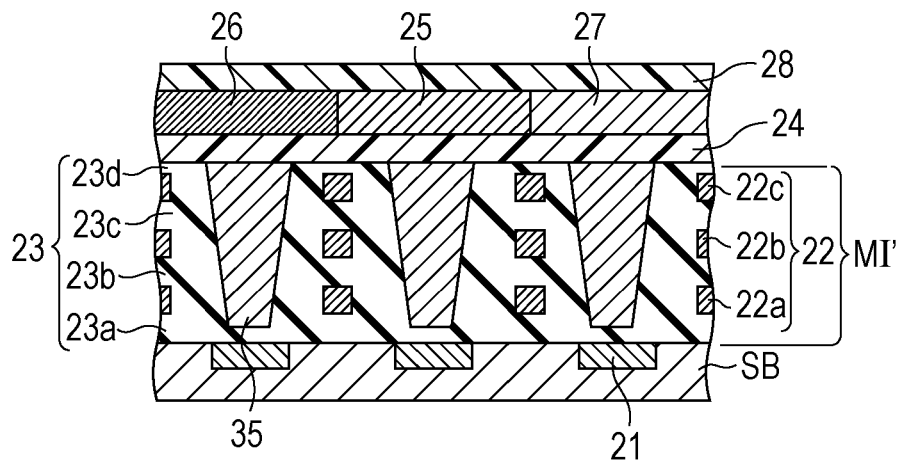
FIGS. 4A and 4B are schematic views illustrating an example of a method for manufacturing a solid state image pickup apparatus (solid state image pickup device) according to a third embodiment of the invention.
Figure 4B:
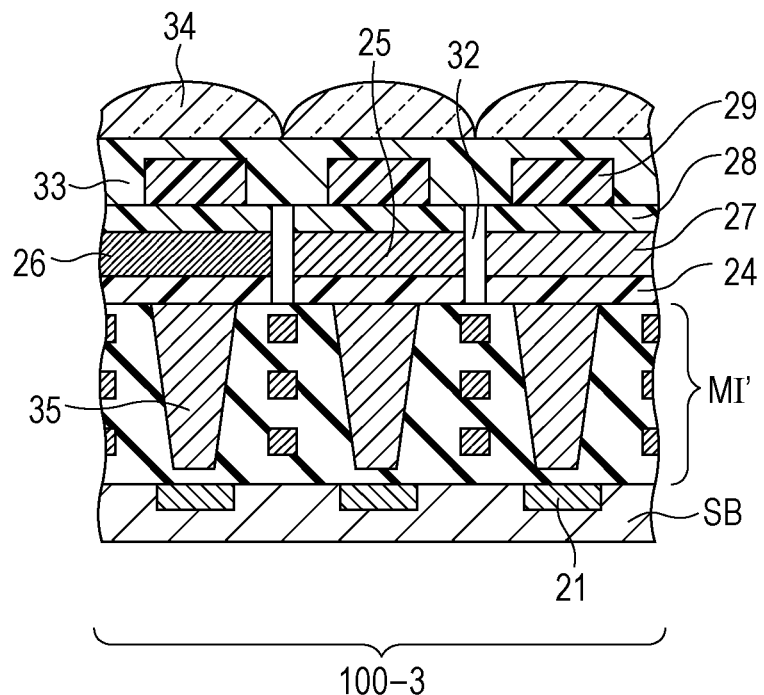

FIGS. 4A and 4B are schematics view illustrating an example of a method for manufacturing a solid state image pickup apparatus (solid state image pickup device) according to the third embodiment of the invention. In FIGS. 4A and 4B, the same configurations as those of illustrated in FIG. 2A to 2H are designated by the same reference numerals. The cross sectional views illustrated in FIGS. 4A and 4B are schematic views illustrating the IV-IV cross section in the pixel row 112b illustrated in FIG. 1.

FIG. 4A is described.

In FIG. 4A, since the configuration of the substrate SB and the other components are the same as those of FIG. 2A in the first embodiment, the description is omitted.

A plurality of light receiving portions 21 are formed on the front surface (upper surface) of the substrate SB, a multilayer wiring structure MI' is formed on the substrate SB as illustrated in FIG. 4A. In the multilayer wiring structure MI' illustrated in FIG. 4A, a lightguide (optical lightguide) 35 corresponding to each light receiving portion 21 is formed above each light receiving portion 21 in the interlayer insulating layer 23 as compared the multilayer wiring structure MI illustrated in FIG. 2A. This lightguide 35 is formed with silicon nitride, for example, as an example. In the example illustrated in FIG. 4, although the insulating layer 23 (first interlayer insulating layer 23a) is present between each light receiving portion 21 and the lightguide 35, this embodiment is limited to this embodiment. For example, the lightguide 35 which penetrates the interlayer insulating layer 23 to contact each light receiving portion 21 may be provided in the interlayer insulating layer 23. By providing the lightguide 35 as described, the light collecting efficiency to each light receiving portion 21 can be increased.

Subsequently, a first planarized layer 24 is formed on the multilayer wiring structure MI' (on the interlayer insulating layer 23 and the lightguide 35).

Subsequently, a first color filter 25, a second color filter 26, and a third color filter 27 which are a plurality of color filter are formed on the first planarized layer 24 using a photolithography method, for example. Herein, each of the color filters 25 to 27 is provided above each light receiving portion 21 corresponding to each light receiving portion 21. Herein, each of the color filters 25 to 27 is formed in such a manner as to contact each other as illustrated in FIG. 4A. In the example illustrated in FIG. 4A, each of the color filters 25 to 27 is formed with the almost same film thickness but may be formed with a different film thickness.

Subsequently, a second planarized layer 28 is formed on each of the color filters 25 to 27.

Thereafter, by passing through each process of FIG. 2B to FIG. 2H in the first embodiment, a solid state image pickup apparatus (solid state image pickup device) 100-3 illustrated in FIG. 4B is produced.

According to the third embodiment, since each process of FIG. 2B to FIG. 2E in the first embodiment is performed, the same operations and the effects as those of the first embodiment can be obtained. More specifically, the hollow portions 32 with a narrower width (for example, about 0.1 μm) can be formed. Thus, the area occupied by the color filter per pixel can be increased, so that the light detection sensitivity by the light receiving portions 21 can be increased.

Fourth Embodiment

Next, a fourth embodiment of the invention is described.

Figure 5A:
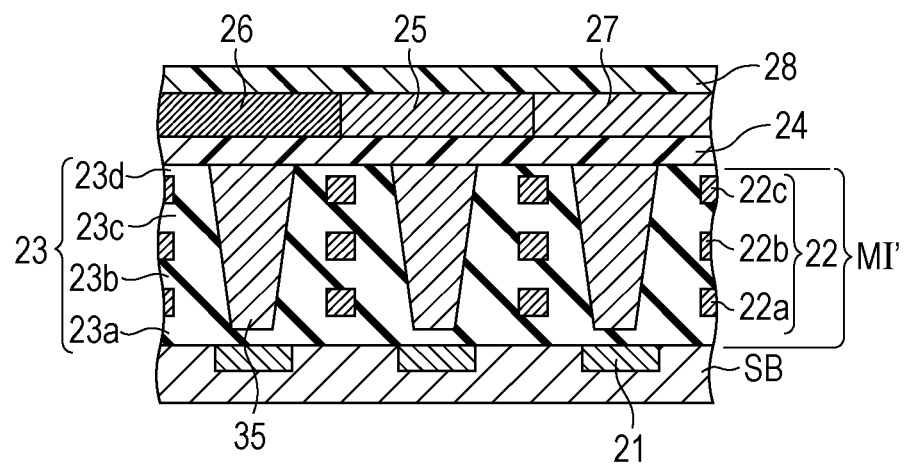
FIGS. 5A and 5B are schematic views illustrating an example of a method for manufacturing the solid state image pickup apparatus (solid state image pickup device) according to the fourth embodiment of the invention.
Figure 5B:
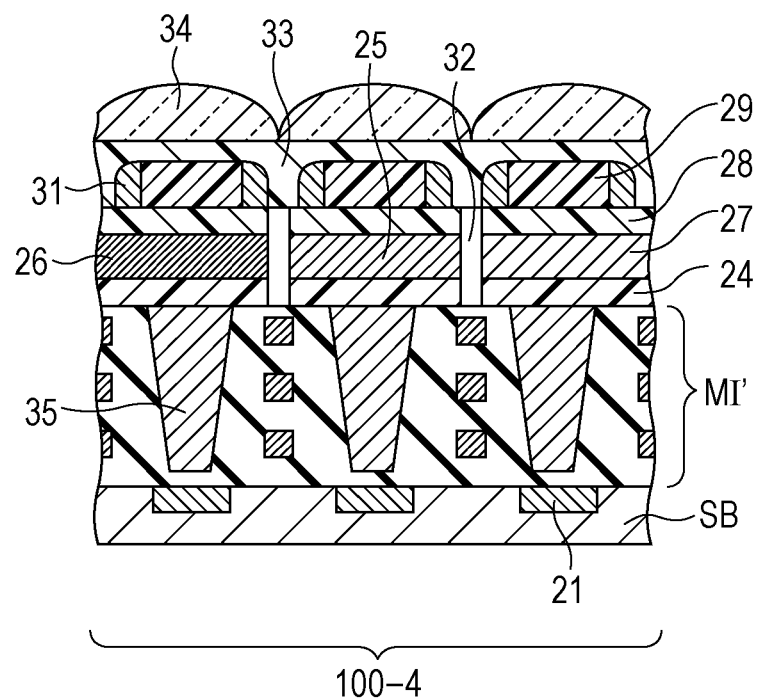

FIGS. 5A and 5B are schematic views illustrating an example of a method for manufacturing a solid state image pickup apparatus (solid state image pickup device) according to the fourth embodiment of the invention. In FIGS. 5A and 5B, the same configurations as those of illustrated in FIGS. 3A and 3G are designated by the same reference numerals. The cross sectional views illustrated in FIGS. 5A and 5B are schematic views illustrating the V-V cross section in the pixel row 112b illustrated in FIG. 1.

FIG. 5A is described.

In FIG. 5A, since the configuration of the substrate SB and the other components are the same as those of FIG. 3A in the second embodiment, the description is omitted.

A plurality of light receiving portions 21 are formed on the front surface (upper surface) of the substrate SB, a multilayer wiring structure MI' is formed on the substrate SB as illustrated in FIG. 5A. In the multilayer wiring structure MI' illustrated in FIG. 5A, a lightguide (optical lightguide) 35 corresponding to each light receiving portion 21 is formed above each light receiving portion 21 in the interlayer insulating layer 23 as compared the multilayer wiring structure MI illustrated in FIG. 3A. This lightguide 35 is formed with silicon nitride, for example. In the example illustrated in FIG. 5, although the insulating layer 23 (first interlayer insulating layer 23a) is present between each light receiving portion 21 and the lightguide 35, this embodiment is limited to this embodiment. For example, the lightguide 35 which penetrates the insulating layer 23 to contact each light receiving portion 21 may be provided in the interlayer insulating layer 23. By providing the lightguide 35 as described, the light collecting efficiency to each light receiving portion 21 can be increased.

Subsequently, a first planarized layer 24 is formed on the multilayer wiring structure MI' (above the interlayer insulating layer 23 and the lightguide 35).

Subsequently, a first color filter 25, a second color filter 26, and a third color filter 27 which are a plurality of color filter are formed on the first planarized layer 24 using a photolithography method, for example. Herein, each of the color filters 25 to 27 is provided above each light receiving portion 21 corresponding to each light receiving portion 21. Herein, each of the color filters 25 to 27 is formed in such a manner as to contact each other as illustrated in FIG. 5A. In the example illustrated in FIG. 5A, each of the color filters 25 to 27 is formed with the almost same film thickness but may be formed with a different film thickness.

Subsequently, a second planarized layer 28 is formed on each of the color filters 25 to 27.

Thereafter, by passing through each process of FIG. 3B to FIG. 3G in the second embodiment, a solid state image pickup apparatus (solid state image pickup device) 100-4 illustrated in FIG. 5B is produced.

According to the fourth embodiment, since each process of FIG. 3B to FIG. 3E in the second embodiment is performed, the same operations and the effects as those of the second embodiment can be obtained. More specifically, the hollow portions 32 with a narrower width (for example, about 0.1 μm) can be formed. Thus, the area occupied by the color filter per pixel can be increased, so that the light detection sensitivity by the light receiving portions 21 can be increased.

Moreover, in the fourth embodiment, since the removal process of the side walls 31 illustrated in FIG. 2F in the first embodiment is not performed, the side walls 31 are formed in the solid state image pickup apparatus 100-4 according to the fourth embodiment. More specifically, in the solid state image pickup apparatus 100-4 according to the fourth embodiment, the side walls 31 are formed in such a manner that one end contacts the side surfaces of the photoresist 29 and the hollow portion 32 is formed in alignment with the other end opposite to the one end in the side walls 31.

Fifth Embodiment

Next, each process in a method for manufacturing a solid state image pickup apparatus (solid state image pickup device) 100 according to a fifth embodiment of the invention is described with reference to FIGS. 6A to 6J.

FIGS. 6A to 6J are cross sectional views illustrating an example of the method for manufacturing the solid state image pickup apparatus (solid state image pickup device) 100 according to the fifth embodiment of the invention. The cross sectional views illustrated in FIGS. 6A to 6J are schematic views illustrating the VI-VI cross section in the pixel row 112*b* illustrated in FIG. 1.

In FIGS. 6A to 6J, the illustration of the wiring layers and interlayer insulation films which are illustrated in the description of the above-described embodiments is omitted.

Figure 6A:
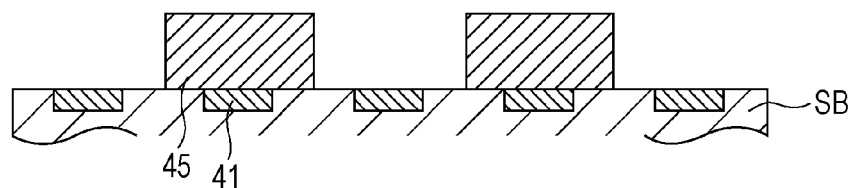
FIGS. 6A to 6J are schematic views illustrating an example of a method for manufacturing a solid state image pickup apparatus (solid state image pickup device) according to a fifth embodiment of the invention.

In a process illustrated in FIG. 6A, first, a plurality of light receiving portions 41 are formed on the front surface (upper surface) of the substrate SB in a two-dimensional matrix shape, for example.

Subsequently, green filters 45 are formed on the light receiving portions 41 of green pixel formation regions using a photolithography method.

Figure 6B:
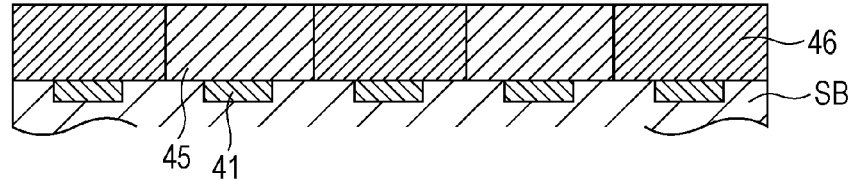

Then, in a process illustrated in FIG. 6B, blue filters 46 are formed on the light receiving portions 41 of blue pixel formation regions using a photolithography method.

Subsequently, red filters (not illustrated in FIG. 6) are formed on the light receiving portions 41 of red pixel formation regions (formation regions of the red pixels of the pixel row 112*a* and the pixel row 112*c* illustrated in FIG. 1) using a photolithography method. Herein, each color filter in the plurality of color filters is formed in such a manner as to contact each other. Each color filter is formed with an organic material, such as acrylic resin, for example.

In the example illustrated in FIG. 6A and FIG. 6B, the blue filters 46 and the red filters (not illustrated in FIG. 6) are formed after the formation of the green filters 45, but the order of the processes may be changed to form each color filter. Thus, in this embodiment, a plurality of color filters corresponding to each light receiving portion in the plurality of light receiving portions 41 are formed above the substrate SB.

Figure 6C:
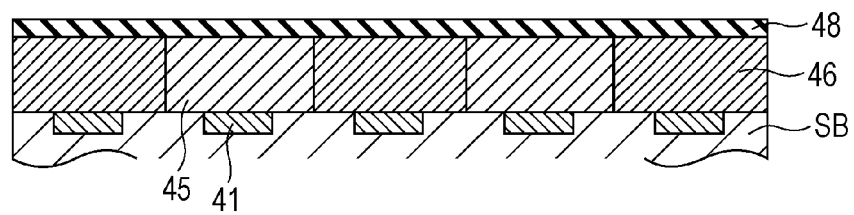
Figure 6D:
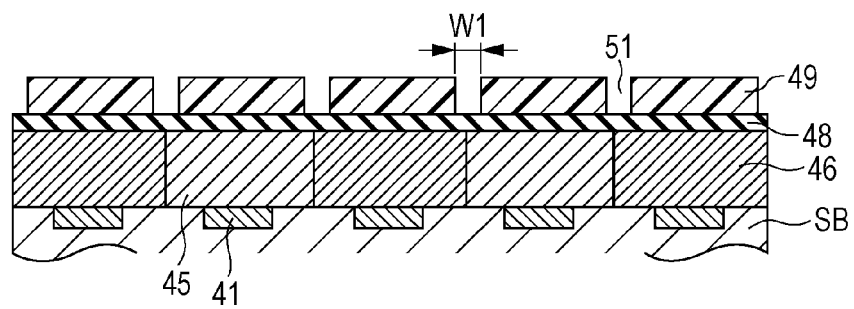

Then, in a process illustrated in FIG. 6C, a hard mask 48 is formed on each color filter including the green filters 45, the blue filters 46, and the red filters (not illustrated in FIG. 6D). This hard mask 48 is formed using a low temperature plasma CVD method, for example, and contains inorganic materials, such as silicon oxide, silicon nitride, and silicon oxynitride, for example. In this case, the film forming temperature of the hard mask 48 is suitably in the range of 150° C. to 220° C. Since the hard mask 48 is not removed in the following process and remains, a material with high transmittance which does not allow a reduction in sensitivity characteristics of the solid state image pickup apparatus 100 is desirable.

Then, in a process illustrated in FIG. 6D, a resist pattern 49 having a first opening 51 which opens in the upper region of the boundary portion of each color filter is formed on the hard mask 48 using a photolithography method. Herein, the width of the first openings 51 is defined as W1. As a material of the resist for forming the resist pattern 49, an organic material, such as novolac resin, styrene resin, or acrylic resin, is mentioned, for example. As the resist for forming the resist pattern 49, a resist for use in the formation of a microlens is suitable because the resist pattern 49 is heated and fluidized in the following process.

Figure 6E:
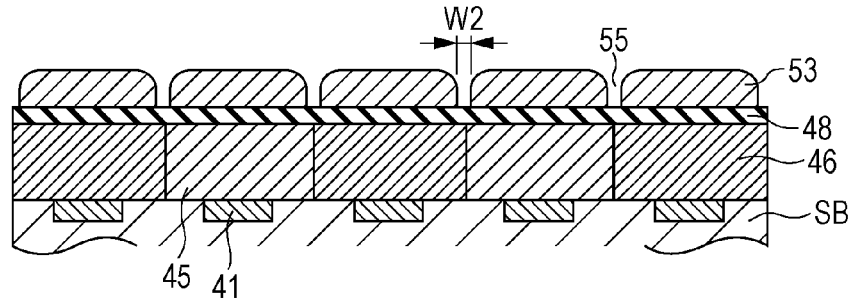

Then, in a process illustrated in FIG. 6E, an etching mask 53 having second openings 55 whose width is smaller than the width of the first openings 51 is formed by heat-treating the resist pattern 49 in two stages. The etching mask 53 is a mask for dry etching the hard mask 48 and the boundary portion of each color filter below the hard mask 48.

Hereinafter, the two-stage heat treatment performed to the resist pattern 49 is described.

First, in the first stage of the heat treatment, by applying a temperature equal to or higher than the softening point of the resist pattern 49 illustrated in FIG. 6D, the resist pattern 49 is heated and fluidized to form the second openings 55 having a width W2 smaller than a width W1 of the first openings 51 (W2<W1). Since the line width (W2) smaller than the resolution line width (W1) by a photolithography method illustrated in FIG. 6 can be formed by the heat treatment of the heating and fluidizing, the width of hollow portions to be formed in and after the following process can be made small. When the width of the air gap is large relative to the dimension of one pixel, light entering the light receiving portions 41 decreases, which becomes a factor of worsening the sensitivity characteristics of the solid state image pickup apparatus 100. Therefore, it is important to make the width of the air gap small.

Subsequently, in the second stage of the heat treatment, a temperature higher than the temperature of the first stage of the heat treatment is applied to thereby accelerate a crosslinking reaction of the resist and stabilize the same.

As described above, the etching mask 53 is a mask for dry etching the hard mask 48 and the boundary portion of each color filter below the hard mask 48. When arranging the etching mask on the surface of a material to be etched and performing anisotropic etching, such as dry etching, it is known that the shape after the etching is affected by the inclined surface of the etching mask. Specifically, this is because etching species (reactive ion and the like) incident to a material to be etched includes an etching species reflecting after hitting the inclined surface of the etching mask. Therefore, when the end portion of the etching mask 53 is inclined, the etching progress direction is affected by the inclination of the etching mask 53, so that the etching proceeds obliquely downward. Therefore, as illustrated in FIG. 6E, when the etching masks 53 facing each other have an inclined surface, the etching shape is tapered depending on the degree of the inclination, so that there may arise a problem in that the color filters cannot be separated and the etching stops in the middle of the etching.

Figure 7:
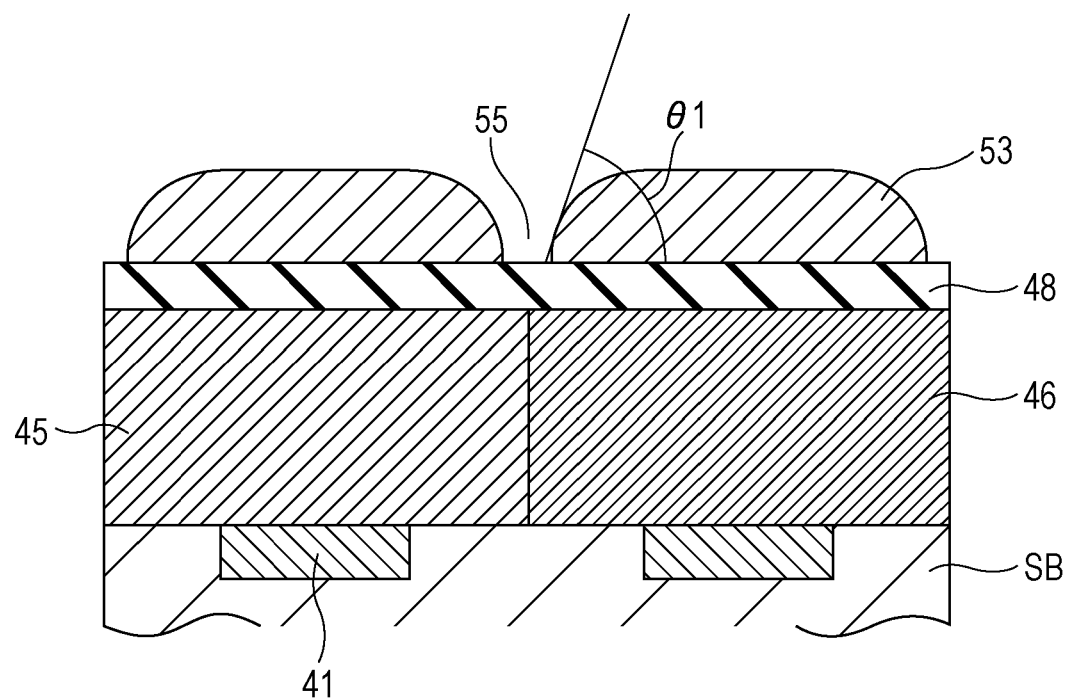
FIG. 7 is an enlarged view illustrating a configuration of two pixels in the solid state image pickup apparatus illustrated in FIG. 6E.

FIG. 7 is a cross sectional view in which the configuration of 2 pixels illustrated in FIG. 6E is enlarged.

In the case of this embodiment, in order to solve the above-described problems, the etching mask 53 is formed in such a manner that the angle (θ1) formed by the tangent on the inclined surface at the end portion of the etching mask 53 and the tangent on the upper surface (front surface) of the hard mask 48 illustrated in FIG. 7 is 76° or more.

Figure 6F:
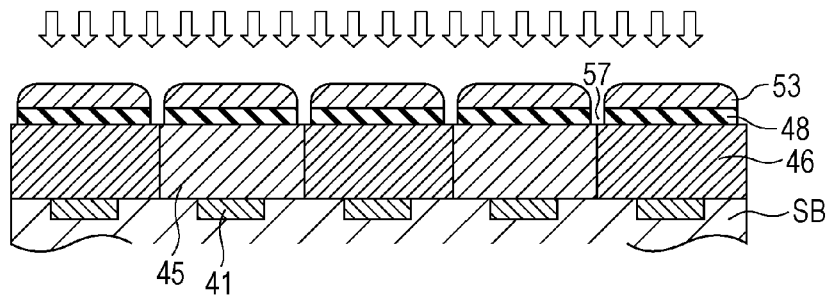

Then, in a process illustrated in FIG. 6F, an opening 57 is formed in the upper region of the boundary portion of each color filter in the hard mask 48 by etching (first etching) using the etching mask 53 as a mask. The openings 57 reflect the openings 55. The etching of the hard mask 48 is performed using fluorocarbon gas, such as CF4, mixed gas of fluorocarbon gas and oxygen gas, or mixed gas of fluorocarbon gas, oxygen gas, and nitrogen gas as etching gas, for example.

Figure 6G:
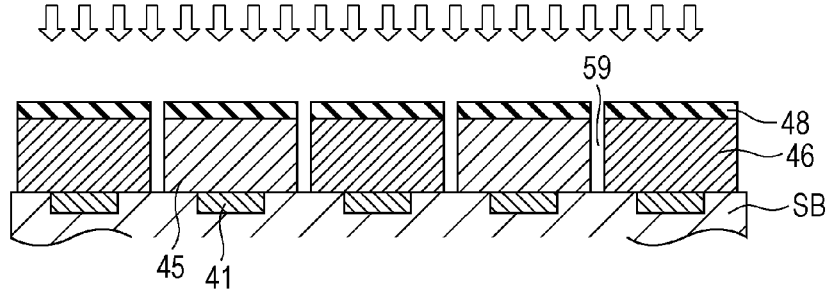

Then, in a process illustrated in FIG. 6G, the opening 59 is formed in the boundary portion of each color filter by etching (second etching) using the hard mask 48 (further etching mask 53) as a mask. The openings 59 reflect the openings 57. The etching (second etching) of the color filter is formed, for example, using mixed gas of oxygen gas, carbon monoxide gas, and nitrogen gas as etching gas under the conditions where the selection ratio of the hard mask 48 and the color filter is sufficiently secured. The etching mask 53 is removed simultaneously with performing the etching of the color filters (second etching). Herein, since the color filters other than the regions of the openings 57 are covered with the hard mask 48, the color filters other than the regions of the openings 59 can be prevented from being damaged in the etching process illustrated in FIG. 6G.

Figure 6H:
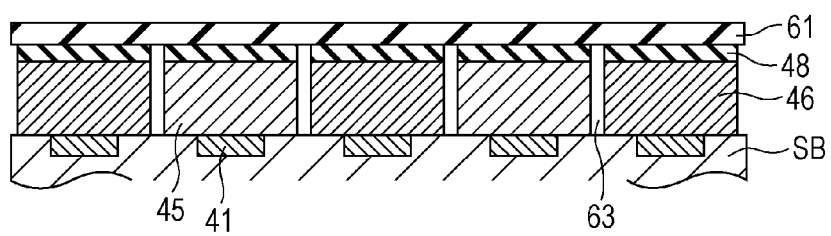

Then, in a process illustrated in FIG. 6H, a cap layer 61 is formed on the entire surface including the upper surface of the hard mask 48 to cover the openings 59 to thereby form a hollow portion 63 between each color filter. The cap layer 61 is formed using a low temperature plasma CVD method, for example, and contains inorganic materials, such as silicon oxide, silicon nitride, and silicon oxynitride, for example. In this case, the film forming temperature of the cap layer 61 is suitably in the range of 150° C. to 220° C. It is desirable that the hard mask 48 and the cap layer 61 contain the same material or a material with the same refractive index. When the materials of the hard mask 48 and the cap layer 61 are different from each other, the refractive indices are different from each other in many cases. Therefore, reflection occurs on the interface between the hard mask 48 and the cap layer 61, which may become a factor of worsening the sensitivity characteristics of the solid state image pickup apparatus 100.

Figure 6I:
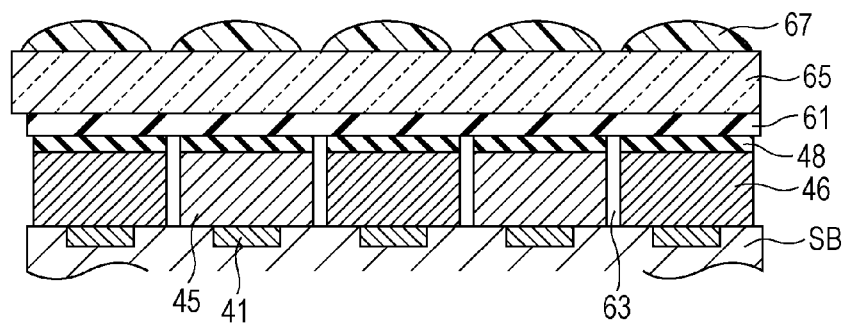
Figure 6J:
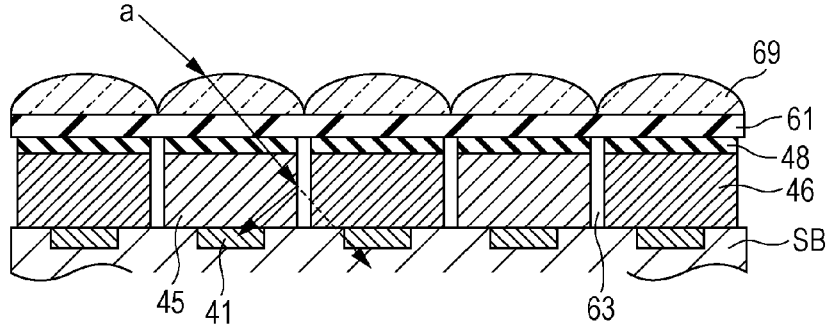

Then, in a process illustrated in FIG. 6I and FIG. 6J, a microlens 69 is formed on the cap layer 61 in such a manner as to correspond to the color filter of each pixel.

In the formation of the microlens 69, first, an organic layer 65 containing an organic material is formed on the cap layer 61, and then a lens shape portion 67 containing an organic material is formed on the organic layer 65 as illustrated in FIG. 6I. Thereafter, the organic layer 65 is etched with the lens shape portion 67, whereby the microlenses 69 of FIG. 6J having a convex surface following the shape of the convex of the lens shape portion 67 are formed.

When an oblique light a illustrated in FIG. 6J enters the microlenses 69 in this embodiment, the light a transmits the microlenses 69, the cap layer 61, and the hard mask 48, and then transmits the color filters, such as the green filter 45, for example. The light a is divided into a light reflecting on the side walls (in the example illustrated in FIG. 6J, an interface of the green filter 45 and the air gap 63) of the color filter and a light refracting without reflecting on the side walls, and the oblique light a is difficult to enter the other light receiving portions 41 adjacent thereto. Thus, when the oblique light a is difficult to enter the other light receiving portions 41 adjacent thereto, color mixing resulting from the oblique light a becomes difficult to occur.

In the method for manufacturing the solid state image pickup apparatus according to this embodiment, the hard mask 48 is formed on each color filter, and the resist pattern 49 having the first opening 51 is formed on the hard mask 48. The first opening 51 is in the upper region of the boundary portion of each color filter. Then, the resist pattern 49 is heat treated to thereby form the etching mask 53 having the second openings 55 whose width is smaller than that of the first openings 51. Then, the first etching using the etching mask 53 as a mask is performed to form the opening 57 in the hard mask 48. The opening 57 is in the upper region of the boundary portion of each color filter. Then, the second etching using at least the hard mask 48 as a mask is performed to form the opening 59 between each color filter. Thereafter, the cap layer 61 covering the openings 59 is formed to form the hollow portion 63 in the boundary portion of each color filter.

According to the method for manufacturing the solid state image pickup apparatus, the process of removing the hard mask formed in order to form the color filters and the process of performing the entire surface etch back or chemical mechanical polishing (CMP) for removing the upper surface of the color filters described in, for example, Japanese Patent Laid-Open No. 2006-295125 are unnecessary. Thus, an increase in the number of processes when patterning the color filters can be suppressed, so that a reduction in manufacturing cost and productivity can be secured.

Furthermore, according to the method for manufacturing the solid state image pickup apparatus, etching is performed in the state where the upper portions in portions other than the boundary portion of the color filters are covered with the hard mask to form the hollow portion between each color filter, the hollow portion can be suitably formed between each color filter while preventing damages to the color filters.

Sixth Embodiment

Next, a sixth embodiment of the invention is described.

The top view illustrating the schematic structure of a solid state image pickup apparatus (solid state image pickup device) according to the sixth embodiment is the same as the top view illustrating the schematic structure of the solid state image pickup apparatus 100 according to the first embodiment illustrated in FIG. 1.

Next, each process in a method for manufacturing a solid state image pickup apparatus (solid state image pickup device) 100 according to the sixth embodiment of the invention is described with reference to FIGS. 8A to 8H.

FIGS. 8A to 8H are cross sectional views illustrating an example of the method for manufacturing the solid state image pickup apparatus (solid state image pickup device) according to the sixth embodiment of the invention. The cross sectional views illustrated in FIGS. 8A to 8H are schematic views illustrating the VIII-VIII cross section in the pixel row 112b illustrated in FIG. 1. In FIGS. 8A to 8H, the same configurations as those of illustrated in FIGS. 6A to 6J in the fifth embodiment are designated by the same reference numerals. In FIGS. 8A to 8H, the illustration of the wiring layers and interlayer insulation films which are illustrated in the description of the above-described embodiments is omitted similarly as in FIGS. 6A to 6J.

Figure 8A:
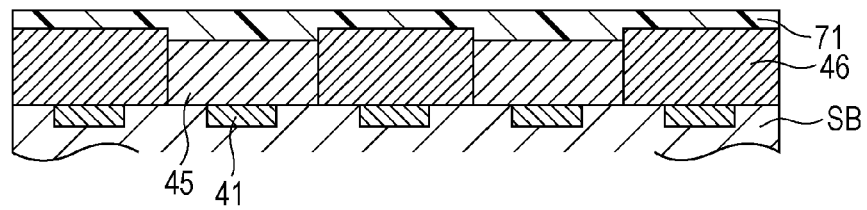

In a process illustrated in FIG. 8A, first, a plurality of light receiving portions 41 are formed on the front surface (upper surface) of the substrate SB in a two-dimensional matrix shape, for example.

Subsequently, green filters 45 are formed on the light receiving portions 41 of green pixel formation regions using a photolithography method.

Then, blue filters 46 are formed on the light receiving portions 41 of blue pixel formation regions using a photolithography method.

Subsequently, red filters (not illustrated in FIG. 8) are formed on the light receiving portions 41 of red pixel formation regions (formation regions of the red pixels of the pixel row 112a and the pixel row 112c illustrated in FIG. 1) using a photolithography method. Herein, each color filter is formed in such a manner as to contact each other. Each color filter is formed with an organic material, such as acrylic resin, for example. The thickness (i.e., upper surface height of each color filter) of each color filter is different from each other.

Thus, in this embodiment, a plurality of color filters corresponding to each light receiving portion in the plurality of light receiving portions 41 are formed above the substrate SB.

Then, a planarized layer 71 is formed on each color filter including the green filters 45, the blue filters 46, and the red filters (not illustrated in FIG. 8). This planarized layer 71 is effective for the case where the thickness (i.e., upper surface height of each color filter) of each color filter is different from each other and there is a level difference between each color filter. More specifically, when the level difference between each color filter is not planarized, there is a possibility that the hard mask to be formed in the following process is not planarized and the etching mask and the like to be formed in the following process are not normally formed. Therefore, it is effective to provide the planarized layer 71. For the planarized layer 71, a material with a high transmittance is desirable and contains, for example, an organic material, such as acrylic resin, novolac resin, or styrene resin.

In the example described above, the blue filters 46 and the red filters (not illustrated in FIG. 8) are formed after the formation of the green filters 45, but the order of the processes may be changed to form each color filter.

Figure 8B:
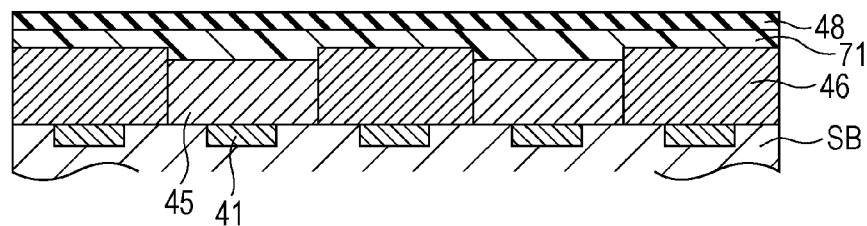

Then, in a process illustrated in FIG. 8B, the hard mask 48 is formed on the planarized layer 71. This hard mask 48 is formed using a low temperature plasma CVD method, for example, and contains inorganic materials, such as silicon oxide, silicon nitride, and silicon oxynitride, for example. In this case, the film forming temperature of the hard mask 48 is suitably in the range of 150° C. to 220° C. Since the hard mask 48 is not removed in the following process and remains, a material with high transmittance which does not allow a reduction in sensitivity characteristics of the solid state image pickup apparatus 100 is desirable.

Figure 8C:
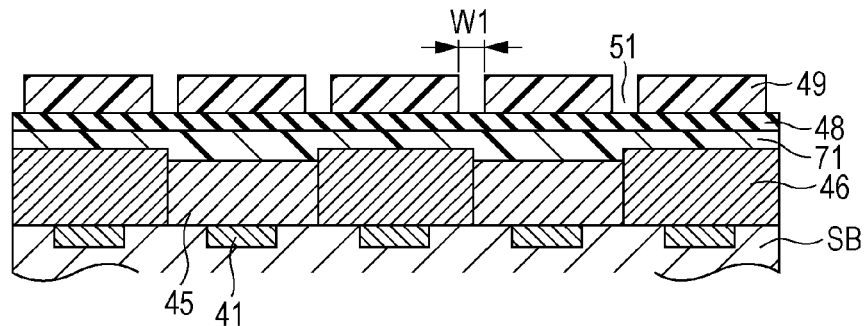

Then, in a process illustrated in FIG. 8C, a resist pattern 49 having a first opening 51 which opens in the upper region of the boundary portion of each color filter is formed on the hard mask 48 using a photolithography method. Herein, the width of the first openings 51 is defined as W1. As a material of the resist for forming the resist pattern 49, an organic material, such as novolac resin, styrene resin, or acrylic resin, is mentioned, for example. As the resist for forming the resist pattern 49, a resist for use in the formation of a microlens is suitable because the resist pattern 49 is heated and fluidized in the following process.

Figure 8D:
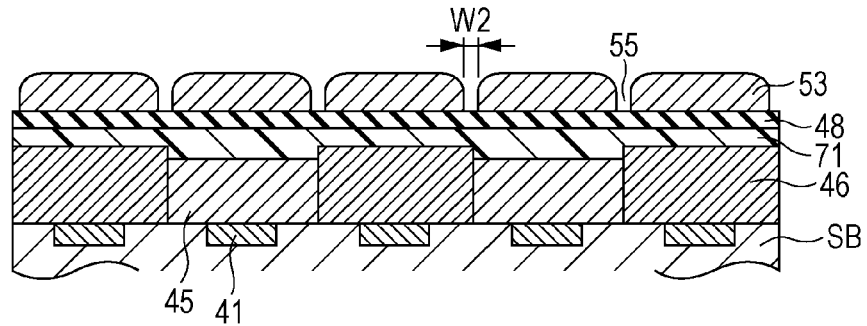

Then, in a process illustrated in FIG. 8D, an etching mask 53 having second openings 55 whose width is smaller than the width of the first openings 51 is formed by heat-treating the resist pattern 49 in two stages. The etching mask 53 is a mask for dry etching the hard mask 48 and the boundary portion of each color filter present below the hard mask 48.

Hereinafter, the two-stage heat treatment performed to the resist pattern 49 is described.

First, in the first stage of the heat treatment, by applying a temperature equal to or higher than the softening point of the resist pattern 49 illustrated in FIG. 8C, the resist pattern 49 is heated and fluidized to form the second openings 55 having a width W2 smaller than a width W1 of the first openings 51 (W2<W1). Since the line width (W2) smaller than the resolution line width (W1) by a photolithography method illustrated in FIG. 8C can be formed by the heat treatment of the heating and fluidizing, the width of hollow portions to be formed in and after the following process can be made small. When the width of the hollow portion is large relative to the dimension of one pixel, light entering the light receiving portions 41 decreases, which becomes a factor of worsening the sensitivity characteristics of the solid state image pickup apparatus 100. Therefore, it is important to make the width of the air gap small.

Subsequently, in the second stage of the heat treatment, a temperature higher than the temperature of the first stage of the heat treatment is applied to thereby accelerate a crosslinking reaction of the resist and stabilize the same.

Also in the case of this embodiment, the etching mask 53 is formed on such a manner that the angle (θ1) formed by the tangent in the inclined surface at the end portion of the etching mask 53 and the tangent on the upper surface (front surface) of the hard mask 48 illustrated in FIG. 7 is 76° or more similarly as in the case of the above-described fifth embodiment.

Then, in a process illustrated in FIG. 8E, an opening 57 is formed in the upper region of the boundary portion of each color filter in the hard mask 48 by etching (first etching) using the etching mask 53 as a mask. The openings 57 reflect the openings 55. The etching of the hard mask 48 is performed using fluorocarbon gas, such as CF4, mixed gas of fluorocarbon gas and oxygen gas, or mixed gas of fluorocarbon gas, oxygen gas, and nitrogen gas as etching gas, for example.

Then, in a process illustrated in FIG. 8F, an opening 59 is formed in the upper region of the boundary portion of each color filter in the planarized layer 71 and between each color filter by etching (second etching) using the hard mask 48 (further etching mask 53) as a mask. The openings 59 reflect the openings 57. The etching (second etching) of this planarized layer 71 and the color filters is performed using, for example, mixed gas of oxygen gas, carbon monoxide gas, and nitrogen gas as etching gas under the conditions where the selection ratio of the hard mask 48 and the planarized layer 71 and the color filter is sufficiently secured. The etching mask 53 is removed simultaneously with performing the etching (second etching) of this planarized layer 71 and the color filters. Herein, since the planarized layer 71 and the color filters other than the regions of the openings 59 are covered with the hard mask 48, the planarized layer 71 and the color filters other than the regions of the openings 59 can be prevented from being damaged in the etch process illustrated in FIG. 8F.

Then, in a process illustrated in FIG. 8G, a cap layer 61 is formed on the entire surface including the upper surface of the hard mask 48 to cover the openings 59 to thereby form a hollow portion 63 between each color filter. The cap layer 61 is formed using a low temperature plasma CVD method, for example, and contains inorganic materials, such as silicon oxide, silicon nitride, and silicon oxynitride, for example. In this case, the film forming temperature of the cap layer 61 is suitably in the range of 150° C. to 220° C. It is desirable that the hard mask 48 and the cap layer 61 contain the same material or a material with the same refractive index.

Then, in a process illustrated in FIG. 8H, a microlens 69 is formed on the cap layer 61 in such a manner as to correspond to the color filter of each pixel. In the formation of the microlens 69, first, an organic layer 65 containing an organic material is formed on the cap layer 61, and then a lens shape portion 67 containing an organic material is formed on the organic layer 65 as illustrated in FIG. 8H. Thereafter, the organic layer 65 is etched with the lens shape portion 67, whereby the microlenses 69 of FIG. 8H having a convex surface following the shape of the convex of the lens shape portion 67 are formed.

According to the method for manufacturing the solid state image pickup apparatus according to this embodiment, the same operations and the same effects as the operations and the effects of the methods for manufacturing the solid state image pickup apparatus according to the first to fifth embodiments described above are demonstrated. More specifically, the air gap can be suitably formed between each color filter while suppressing an increase in the number of processes when patterning the color filters.

Other Embodiments

Moreover, in the solid state image pickup apparatus (solid state image pickup device) 100 according to the first to sixth embodiments described above, an inner lens (interlayer lens)

corresponding to each light receiving portion 21 may be provided between the multilayer wiring structure (interlayer insulating layer 23) and the first planarized layer 24. As an example, convex inner lenses containing silicon nitride, for example, are provided. Thus, by providing the inner lenses to thereby use the inner lenses and the microlenses 34 in combination, the light collecting efficiency to each light receiving portion 21 can be increased.

Moreover, in the solid state image pickup apparatus (solid state image pickup device) 100 according to the first to sixth embodiments described above, the second planarized layer 28 is formed on each of the color filters 25 to 27 but the second planarized layer 28 may not be formed.

Each embodiment of the invention described above simply describes a specific example when enforcing the invention and the technical scope of the invention is not limited. More specifically, the invention can be enforced in various aspects without deviating from the technical idea or the main feature thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-005601 filed Jan. 16, 2013 and No. 2013-045677 filed Mar. 7, 2013, which are hereby incorporated by reference herein in their entirety.

What is claimed is:

1. A method for manufacturing a solid state image pickup apparatus in which a plurality of light receiving portions are provided on a semiconductor substrate, comprising:
   forming a plurality of color filters corresponding to each light receiving portion above the semiconductor substrate in such a manner as to contact each other;
   forming a photoresist having openings above the plurality of color filters;
   forming side walls on side surfaces of the photoresist; and
   forming a hollow portion between each color filter by performing etching using at least the side walls as a mask.

2. The method for manufacturing a solid state image pickup apparatus according to claim 1, further comprising forming a cap layer covering the hollow portions.

3. The method for manufacturing a solid state image pickup apparatus according to claim 1, wherein the photoresist contains a heat resistant material resistant to 200° C. or higher.

4. The method for manufacturing a solid state image pickup apparatus according to claim 1, wherein the photoresist contains a material whose transmittance of light having a wavelength of 400 nm to 700 nm is 80% or more.

5. The method for manufacturing a solid state image pickup apparatus according to claim 1, wherein, in the formation of the side walls, an oxide film is formed on the entire surface including an upper surface and the side surfaces of the photoresist, and then the oxide film is etched using an anisotropic dry etching method in such a manner as to leave the oxide film on the side surfaces of the photoresist to form the side walls.

6. The method for manufacturing a solid state image pickup apparatus according to claim 5, wherein, in the formation of the side walls, the oxide film is left also on the upper surface of the photoresist.

7. The method for manufacturing a solid state image pickup apparatus according to claim 5, wherein gas for use in the etching in the formation of the hollow portions is oxygen gas, carbon monoxide gas, and nitrogen gas, and
   gas for use in the etching of the oxide film is fluorocarbon gas and argon gas.

8. The method for manufacturing a solid state image pickup apparatus according to claim 1, further comprising forming a microlens corresponding to each light receiving portion above each color filter in the plurality of color filters.

9. The method for manufacturing a solid state image pickup apparatus according to claim 1, further comprising forming a lightguide corresponding to each light receiving portion in the plurality of light receiving portions above the semiconductor substrate, wherein
   the plurality of color filters are formed above the plurality of lightguides.

* * * * *